United States Patent
Seth et al.

(10) Patent No.: US 9,252,707 B2
(45) Date of Patent: Feb. 2, 2016

(54) MEMS MASS BIAS TO TRACK CHANGES IN BIAS CONDITIONS AND REDUCE EFFECTS OF FLICKER NOISE

(71) Applicant: Silicon Laboratories Inc., Austin, TX (US)

(72) Inventors: Manu Seth, Berkeley, CA (US); Aaron Caffee, Scappoose, OR (US)

(73) Assignee: Silicon Laboratories Inc., Austin, TX (US)

(*) Notice: Subject to any disclaimer, the term of this patent is extended or adjusted under 35 U.S.C. 154(b) by 316 days.

(21) Appl. No.: 13/721,642

(22) Filed: Dec. 20, 2012

(65) Prior Publication Data
US 2014/0176251 A1 Jun. 26, 2014

(51) Int. Cl.
*H03B 5/36* (2006.01)

(52) U.S. Cl.
CPC .............. *H03B 5/362* (2013.01); *H03B 5/366* (2013.01)

(58) Field of Classification Search
CPC ........... H03B 28/00; H03B 5/32; H03B 5/362
USPC ............ 331/116 R, 154, 158, 163, 185, 186; 310/315; 257/415
See application file for complete search history.

(56) References Cited

U.S. PATENT DOCUMENTS

| | | |
|---|---|---|
| 8,305,154 B1* | 11/2012 | Kubena et al. ............... 331/163 |
| 2003/0052742 A1* | 3/2003 | Niu et al. ..................... 331/154 |
| 2005/0174183 A1* | 8/2005 | Tachibana et al. ............ 331/158 |
| 2009/0057792 A1* | 3/2009 | Steeneken et al. ............ 257/415 |
| 2011/0257706 A1* | 10/2011 | Karr ............................... 607/60 |
| 2012/0032555 A1* | 2/2012 | Koning et al. ................ 310/315 |
| 2012/0032747 A1* | 2/2012 | Vermeeren et al. ........... 331/154 |
| 2012/0262241 A1* | 10/2012 | Phan Le et al. ............... 331/154 |
| 2013/0147567 A1* | 6/2013 | Yamakawa et al. ........... 331/154 |

* cited by examiner

*Primary Examiner* — Jeffrey Shin
(74) *Attorney, Agent, or Firm* — Abel Law Group, LLP

(57) ABSTRACT

A technique for tracking changes in bias conditions of a microelectromechanical system (MEMS) device includes applying an electrode bias signal to an electrode of the MEMS device. The technique includes applying a mass bias signal to a mass of the MEMS device suspended from a substrate of the MEMS device. The technique includes generating the mass bias signal based on a target mass-to-electrode bias signal level and a signal level of the electrode bias signal.

20 Claims, 4 Drawing Sheets

MEMS MASS BIAS TO TRACK CHANGES IN BIAS CONDITIONS AND REDUCE EFFECTS OF FLICKER NOISE

BACKGROUND

1. Field of the Invention

The invention is related to microelectromechanical systems (MEMS) devices.

2. Description of the Related Art

In general, a MEMS transducer converts energy between electrostatic and mechanical forms. MEMS transducers include both sensors that convert motion into electrical energy (accelerometers, pressure sensors, etc.) and actuators that convert electrical signals to motion (comb drive, micromirror devices, oscillators). MEMS devices using capacitive transducers are easy to manufacture and result in low noise and low power consumption sensors and/or actuators.

Capacitive sensing is based on detecting a change in capacitance of a capacitor. If a known voltage is applied across the capacitor, changes in current due to capacitive variations will appear in response to motion of one plate of the capacitor relative to another plate of the capacitor. Typically, fixed DC bias voltages are applied to the mass and electrodes of a MEMS device. Changes in the DC bias voltages can change an apparent acceleration of a mass of a MEMS device and can increase noise in a MEMS sensor system.

Similarly, capacitive actuation is based on variation in capacitance of the MEMS device. A DC operating point is established by applying a DC bias voltage across the capacitor and an AC signal changes the capacitance causing changes in force on a plate of the capacitor. Variations in the DC bias voltage applied across the capacitor can affect the force on the plate and thereby change the resulting mechanical energy of the MEMS device. Variations in the DC transduction bias voltage applied across the capacitor can affect frequency of oscillation of MEMS resonators.

Accordingly, techniques for stabilizing a DC bias voltage across a capacitor of a MEMS transducer are desired.

SUMMARY OF EMBODIMENTS OF THE INVENTION

In at least one embodiment of the invention, a method includes applying an electrode bias signal to an electrode of a microelectromechanical system (MEMS) device. The method includes applying a mass bias signal to a mass of the MEMS device suspended from a substrate of the MEMS device. The method includes generating the mass bias signal based on a target mass-to-electrode bias signal level and a signal level of the electrode bias signal.

In at least one embodiment of the invention, an apparatus includes a microelectromechanical system (MEMS) device. The MEMS device includes a first electrode configured to receive an electrode bias signal. The MEMS device includes a mass suspended from a substrate. The mass is configured to receive a mass bias signal. The apparatus includes a mass bias signal generator configured to generate the mass bias signal based on a target mass-to-electrode bias signal and a signal level of the electrode bias signal.

BRIEF DESCRIPTION OF THE DRAWINGS

The present invention may be better understood by, and its numerous objects, features, and advantages made apparent to, those skilled in the art by referencing the accompanying drawings.

The use of the same reference symbols in different drawings indicates similar or identical items.

DETAILED DESCRIPTION

Figure 1:
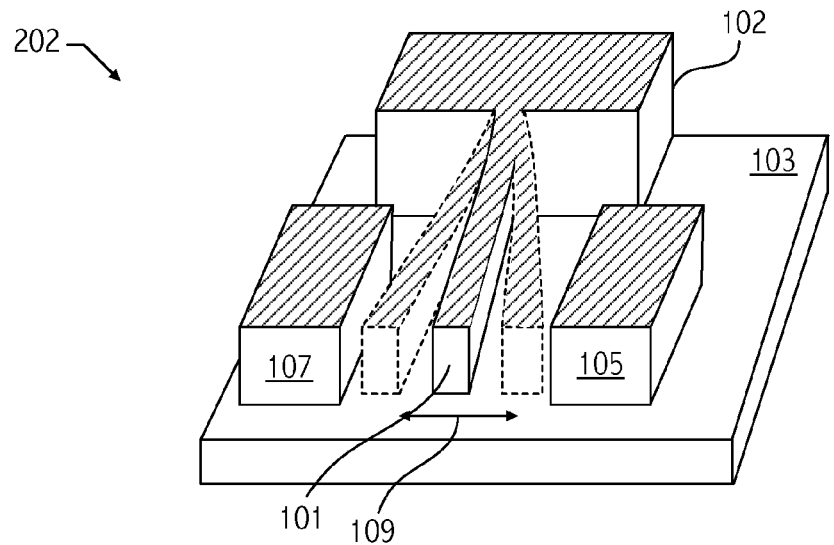
FIG. 1 illustrates a conventional MEMS device.

Referring to FIG. 1, exemplary MEMS device 202 is formed using substrate 103, which may include a CMOS integrated circuit. MEMS device 202 may be any device that falls within the scope of MEMS technologies. For example, MEMS device 202 may be any mechanical and electronic structure having a critical dimension of less than approximately 250 microns and fabricated above a substrate using lithography, deposition, and etching processes. MEMS device 202 may be a device such as, but not limited to, a resonator (e.g., an oscillator), a temperature sensor, a pressure sensor or an inertial sensor (e.g., an accelerometer or a gyroscope). MEMS device 202 may have a portion suspended from the substrate (i.e., a suspended mass), which includes an integrated circuit (not shown). In one embodiment, the suspended portion of MEMS device 202 is a suspended mass 101 having a resonant frequency and suspended form substrate 103 by anchor 102. For example, the suspended mass of MEMS device 202 is a feature such as, but not limited to, a beam, a plate, a cantilever arm or a tuning fork. In a specific embodiment, MEMS device 202 includes a resonating feature (e.g., suspended mass 101) flanked by a drive electrode 105 and a sense electrode 107. Note that although MEMS device 100 is illustrated as having a single drive electrode 105 and a single sense electrode 107 that are responsive to respective single-ended signals, MEMS device 202 may include multiple drive electrodes and multiple sense electrodes that are responsive to corresponding differential signals.

Figure 2:
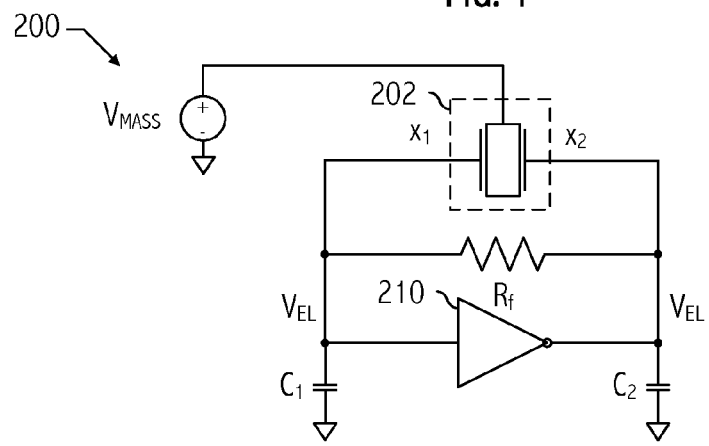
FIG. 2 illustrates a circuit diagram of an exemplary MEMS oscillator circuit.

Referring to FIG. 2, in an exemplary application, MEMS oscillator 200 includes MEMS device 202 coupled to amplifier 210. Sense electrode $x_1$ generates a signal based on energy transfer from a vibrating mass of MEMS device 202, thereby converting mechanical energy into an electrical signal. A large feedback resistor ($R_F$) biases amplifier 210 in a linear region of operation, thereby causing amplifier 210 to operate as a high-gain inverting amplifier. MEMS oscillator 200 sustains vibrations of MEMS device 202 by feeding back the output of amplifier 210 to a drive electrode of MEMS device 202. Amplifier 210 receives a small-signal voltage from sense electrode $x_1$ and generates a voltage on drive electrode $x_2$ that causes the mass of MEMS device 202 to continue to vibrate. MEMS device 202 in combination with capacitances $C_1$ and $C_2$ form a pi-network band-pass filter that provides 180 degrees of phase shift and a voltage gain from drive electrode $x_2$ to sense electrode $x_1$ at approximately the resonant frequency of MEMS device 202.

In general, bias signals added at various points of a circuit determine an operating point of the circuit and may be predetermined, fixed DC voltages or currents added to AC signals. The mass of MEMS device 202 receives a DC bias voltage, $V_{MASS}$, which is generated by a precision voltage reference or voltage regulator. Sense electrode $x_1$ and drive electrode $x_2$ receive a DC bias voltage $V_{EL}$, which is typically based on the amplifier bias point and is different from $V_{MASS}$. Transduction of MEMS device 202 is based on the voltage difference across the transduction gap (i.e., the voltage difference between the mass and the electrode, $V_{ME}$). However, the amplifier bias point may vary as a function of environmental factors (e.g., temperature, strain, aging, etc.), causing the bias voltage on the sense electrode $x_1$ and drive electrode $x_2$ to vary, while the bias voltage on the mass remains constant since it is supplied by a voltage regulator or precision voltage reference.

In general, a combined mechanical and equivalent electrical spring constant, k, (i.e., stiffness, where $k_m$ is a mechanical stiffness, $k_e$ is an electrical stiffness, and $k=k_m+k_e$) of a MEMS device describes how the system behaves around the equilibrium point. A change in bias voltage changes the electrical stiffness and resonance frequency of the capacitive transducer. The stiffness of the system and the resonance frequency ($\omega=\sqrt{k/m}$) decrease with increasing bias voltage. At higher frequencies, the mechanical stiffness is greater and change in bias voltage has less of an overall effect on the stiffness and thus the resonant frequency. In applications that use direct current coupling between the electrodes and sustaining amplifier (e.g., MEMS oscillator 200), then applying a fixed voltage to the mass will cause frequency pulling (e.g., 1000 ppm/V or more) based on changes in the DC bias point of the amplifier. Some MEMS oscillator applications have a strict frequency tolerance (e.g., +/−10 ppm at 10° C.). For example, low-frequency MEMS oscillators (e.g., $f_o$<1 MHz) may have a substantial sensitivity of the frequency of oscillation to the voltage between the mass and electrode. Although the change in $V_{ME}$ also affects higher frequency MEMS oscillators, the higher frequency MEMS oscillators have greater stiffness and the change in bias voltage results in a lesser frequency change than for lower frequency MEMS oscillators. To reduce frequency-pulling due to bias voltage variations, typical MEMS oscillators use AC coupling capacitors coupled to the electrodes (e.g., between the amplifier and the MEMS device). At low frequencies, the AC coupling needs a lower cutoff frequency, therefore requiring larger resistances. Flicker noise (i.e., 1/f noise) present across the MEMS transducation gap will modulate the frequency, which may increase the phase noise of the oscillator and may cause the oscillator to operate outside of a target operating specification.

Figure 3:
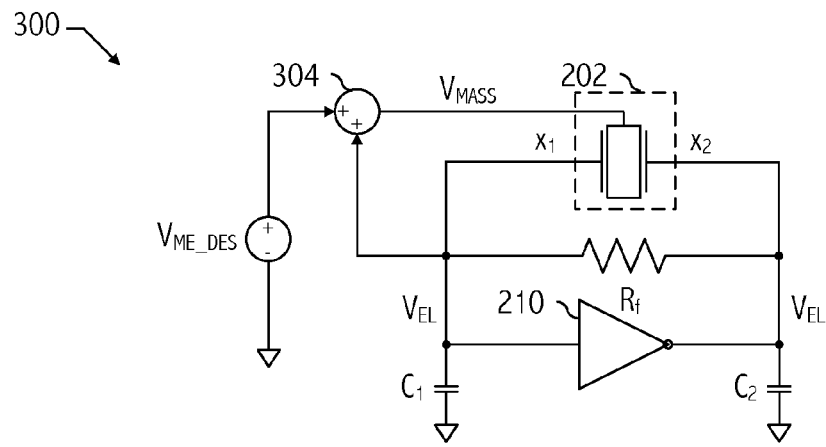
FIG. 3 illustrates a circuit diagram of a MEMS oscillator circuit including a MEMS device receiving a mass bias signal to track changes in bias conditions consistent with at least one embodiment of the invention.

Referring to FIG. 3, rather than implementing the MEMS system using AC coupling, a technique for reducing effects of the change in electrode bias voltage on MEMS system performance includes application of a pedestal voltage (i.e., bootstrap voltage or boost voltage) in combination with the electrode bias voltage to generate a bias voltage for application to the mass of the MEMS device. The pedestal voltage is a reference voltage having a level equal to a target mass-electrode voltage ($V_{ME}$). Summing module 304 combines that pedestal voltage with the electrode bias voltage ($V_{EL}$) to generate the bias voltage provided to the mass of MEMS 202. This technique results in a mass-electrode voltage having a level approximately equal to the target mass-electrode voltage (i.e., $V_{MASS} - V_{EL} = (V_{ME\_DES} + V_{EL}) - V_{EL} = V_{ME\_DES}$). Any changes in the electrode bias voltage $V_{EL}$ due to environmental factors are compensated by the electrode voltage component of the voltage applied to the mass. In addition to reducing or cancelling effects of environmental variations of the amplifier, the bandwidth of the bootstrapping technique may be wide enough to reduce or eliminate other noise introduced by the amplifier. Ideally, if the amplifier bias voltage including flicker noise is added to the target mass-electrode voltage, $V_{ME\_DES}$, then the flicker noise at the body will cancel the flicker noise at the electrode and flicker noise will not be a source of modulation through the resonator.

Figure 4:
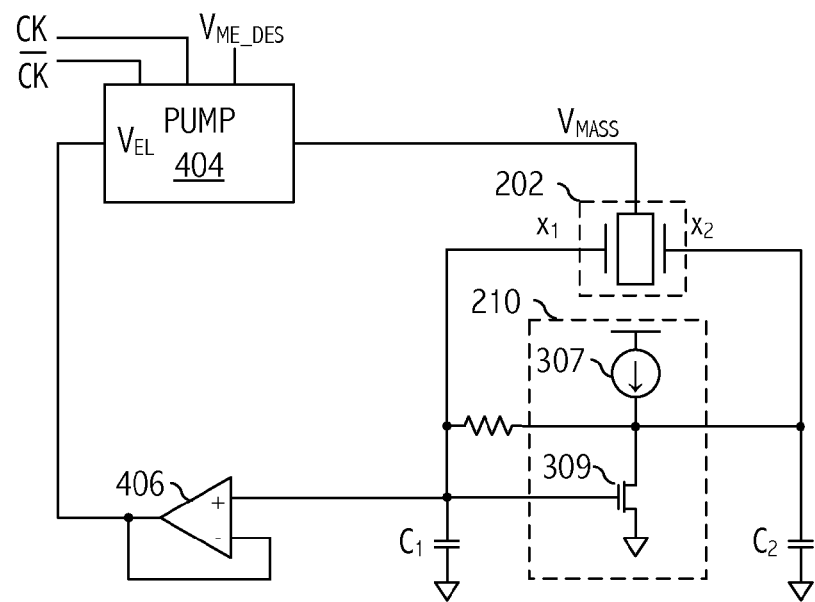
FIG. 4 illustrates a functional block diagram of a MEMS oscillator circuit including a MEMS device receiving a mass bias signal based on a buffered electrode bias signal to track changes in bias conditions consistent with at least one embodiment of the invention.
Figure 5:
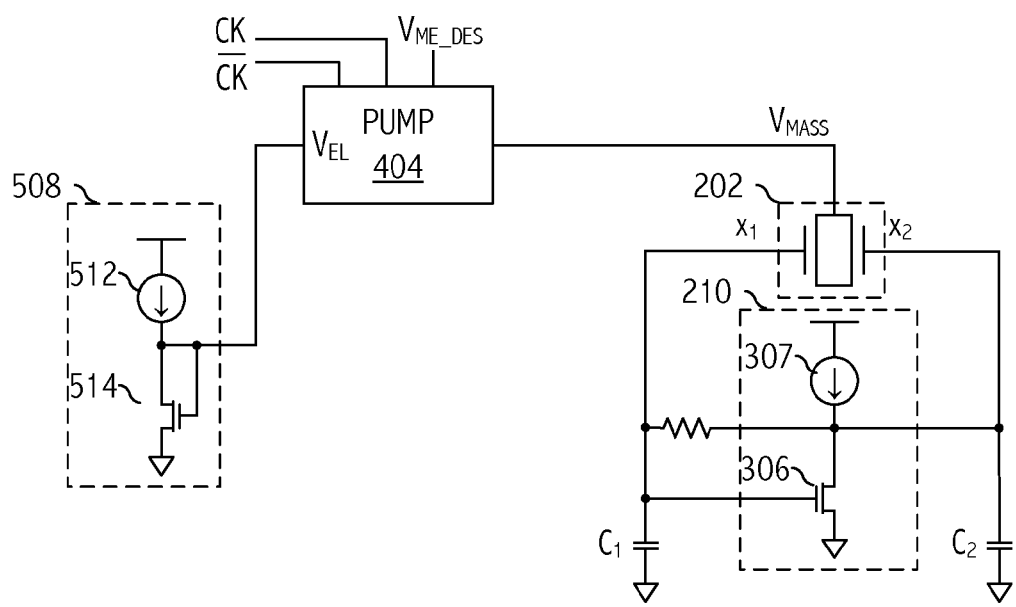
FIG. 5 illustrates a functional block diagram of a MEMS oscillator circuit including a MEMS device receiving a mass bias signal based on a replica voltage to track changes in electrode bias conditions consistent with at least one embodiment of the invention.

Since the target DC bias voltages applied to the mass are typically greater than the power supply voltage (e.g. mass bias voltages of 3V or higher), charge pump techniques may be used to combine the electrode bias voltage $V_{EL}$ and the target mass-electrode voltage level $V_{ME\_DES}$ to generate the mass bias voltage $V_{MASS}$. Referring to FIG. 4, in at least one embodiment of the MEMS bias change tracking technique, unity-gain amplifier 406 buffers the electrode bias voltage and provides a buffered bias voltage to charge pump 404. However, in other embodiments of the MEMS bias change tracking technique, a replica generator provides a replica of the electrode bias voltage to charge pump 404. Referring to FIG. 5, replica buffer 508 is a replica of amplifier 210 and includes a circuit having the same elements and configuration as amplifier 210. Environmental factors will affect replica buffer 508 in the same way as they affect amplifier 210. However, since the noise of amplifier 210 is uncorrelated with the noise of the replica buffer 508, the technique will not reduce that noise.

Figure 6:
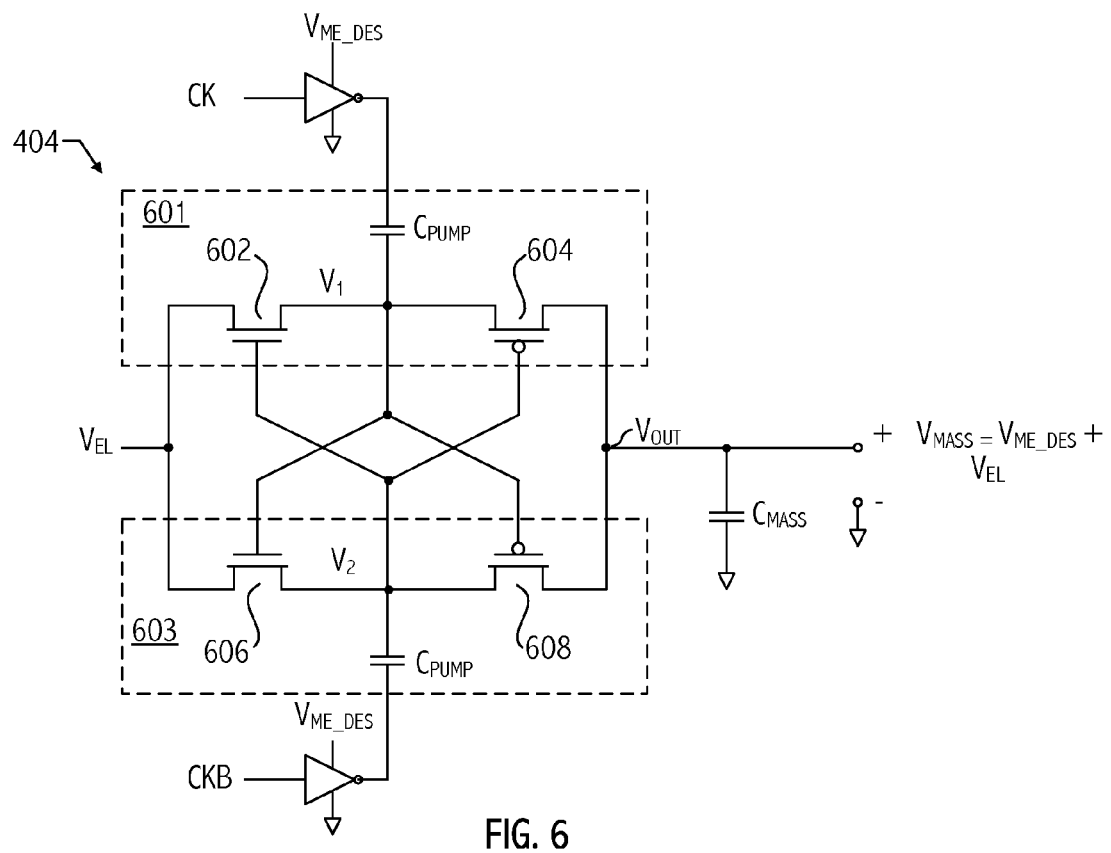
FIG. 6 illustrates a circuit diagram of a charge pump configured to boost the electrode bias voltage by a target mass-electrode voltage level consistent with at least one embodiment of the invention.
Figure 7:
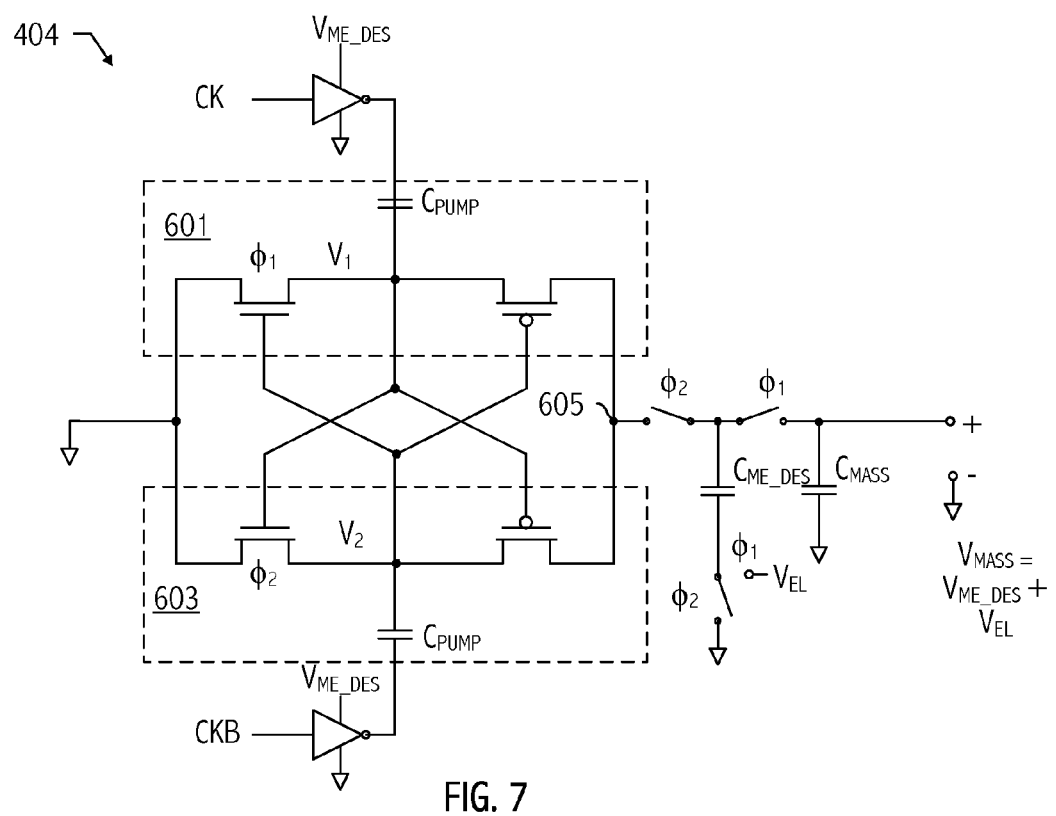
FIG. 7 illustrates a circuit diagram of a charge pump configured to apply the electrode bias voltage to a target mass-electrode voltage level consistent with at least one embodiment of the invention.

Referring to FIGS. 4, 5, and 6, in at least one embodiment, charge pump 404 boosts the electrode bias voltage by the target mass-electrode voltage level to generate the mass bias voltage. Latch-based charge pump stage 404 boosts a control clock CK having a range of $V_{ME\_DES}$ to generate level-shifted clock $V_1$, which is used to control devices 602 and 604. Similarly, latch-based charge pump stage 404 boosts control clock CKB to generate level-shifted clock $V_2$, which is used to control devices 606, and 608. Level-shifted clocks $V_1$ and $V_2$ oscillate between the voltage levels on the input node, $V_{EL}$ and the voltage level on the output node, $V_{OUT}$, where $V_{OUT}$ is a boosted version of $V_{EL}$. That is, $V_{OUT} = V_{EL} + V_{ME\_DES}$. Charge pump stage 404 is a double charge pump stage, i.e., it includes independent charge pump branches 601 and 603 that are coupled to the same input and output nodes. Since the two phases of the control clock signal, CK and CKB, are out-of-phase, level-shifted clocks $V_1$ and $V_2$ are also out-of-phase, resulting in branches 603 and 605 alternating pumping the output voltage level to a pumped voltage level, e.g., to a voltage level of approximately $V_{EL} + V_{ME\_DES}$. This implementation introduces a delay that limits the bandwidth of the MEMS bias tracking technique. Referring to FIGS. 4, 5, and 7, in at least one other embodiment of charge pump 404, the latency associated with generating the mass bias voltage is reduced by boosting, by $V_{EL}$, node 605 of the charge pump, which has already been charged to voltage $V_{ME\_DES}$, by charge pump branches 601 and 603. However this technique requires use of additional output switches that may not be easily implemented from a pumped voltage supply. Note that embodiments of charge pump 404 illustrated in FIGS. 6 and 7 are exemplary only and other techniques for generating $V_{MASS}$ may be used.

Figure 8:
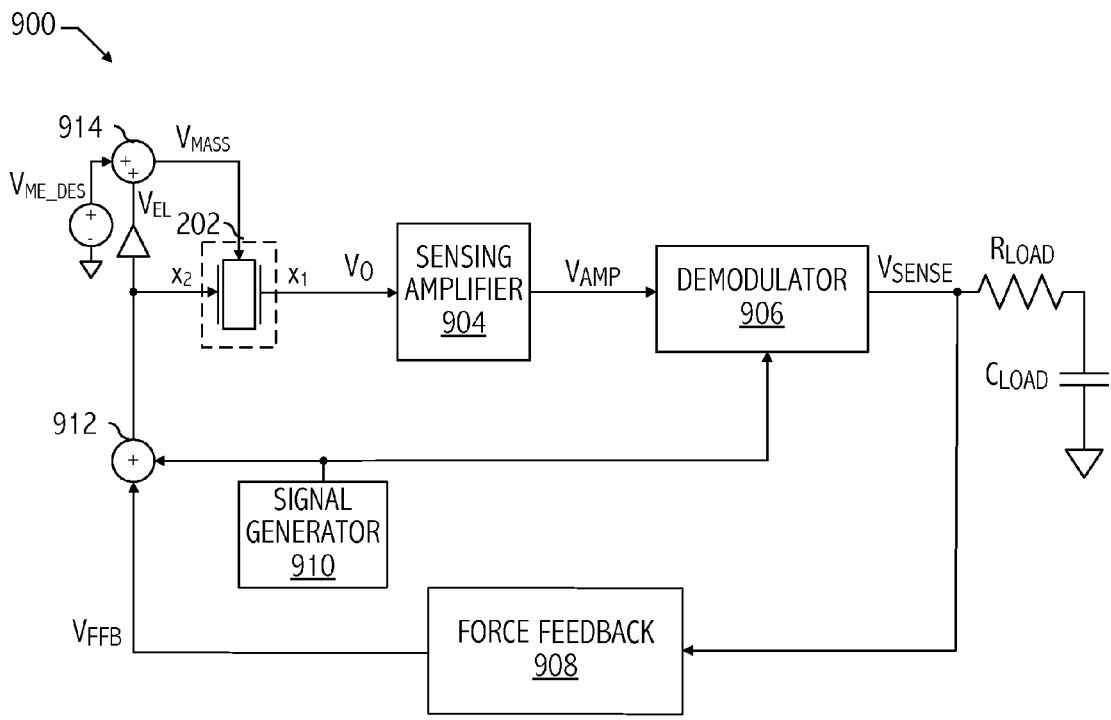
FIG. 8 illustrates a functional block diagram of a MEMS sensor system using force feedback consistent with at least one embodiment of the invention.
Figure 9:
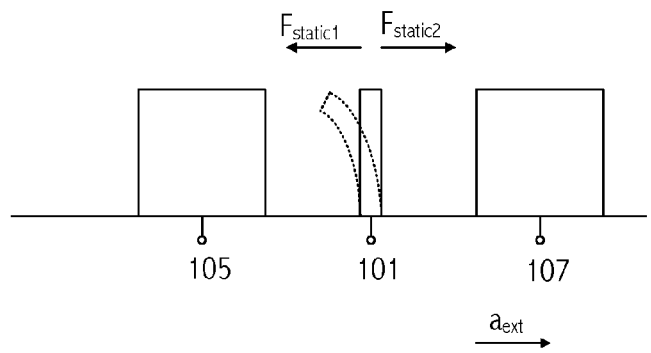
FIG. 9 illustrates forces acting on a MEMS device of the MEMS sensor system of FIG. 8 consistent with at least one embodiment of the invention.

Thus, techniques for tracking changes in bias conditions to reduce frequency pulling and flicker noise in a MEMS resonator have been described. Although the technique is described with reference to a MEMS resonator application, techniques described herein apply to other MEMS applications (e.g., sensor applications). For example, referring to FIGS. 1, 8, and 9, MEMS device 202 may be configured as an accelerometer (e.g., single axis accelerometer or a multi-axis accelerometer). If the accelerating reference frame of MEMS device 202 moves, then mass 101 will deflect. MEMS device 202 generates an output signal (e.g., $V_O$) indicating a change in capacitance due to mechanical movement (i.e., displacement) of the mass with respect to the frame (e.g., substrate 103). In at least one embodiment of MEMS device 202, the capacitive displacement measurement is carried out using a sensing signal, which is an AC excitation signal having a frequency $f_{SENSE}$ (e.g., 10 kHz<$f_{SENSE}$<1 MHz), and results in an AC output signal that is characterized by a small current at a high frequency. Displacements are measured using a signal having a frequency $f_{SENSE}$. Sensing amplifier 904 gains the MEMS output signal and provides the amplified output signal (e.g., $V_{AMP}$) to demodulator 906, which demodulates the amplified output signal (e.g., by multiplying the amplified output signal with the original excitation signal using a mixer) to obtain a DC signal (i.e., baseband signal, e.g., $V_{SENSE}$) having voltage levels proportional to the displacement of the mass with respect to the frame. In at least one embodiment, a low-pass filter (not shown) is used to reduce or eliminate high frequency components before delivering the signal to a signal processor or other load circuit, which is illustrated by a representative load having $R_{LOAD}$ and $C_{LOAD}$.

To reduce nonlinear effects, MEMS system 900 implements a force feedback technique. The technique applies a feedback force to drive electrode $x_2$ to keep the mass at its equilibrium position (i.e., no displacement). The feedback control signal $V_{FFB}$ is generated based on sensed displacements of the mass with respect to a frame (e.g., substrate) of the MEMS device. In at least one embodiment of force feedback module 908, the feedback control signal, $V_{FFB}$, maintains the mass of the MEMS device in its equilibrium position to reduce or eliminate occurrence of non-linear behavior of the mass movement as compared to a MEMS system without force feedback. Since the apparent acceleration of the mass is based on the force-feedback signal applied to the drive electrode given the DC bias applied to the mass, changes in environmental conditions will change the apparent acceleration and sensed displacement of the MEMS device, resulting in a less accurate sensor. However, by incorporating the MEMS bias tracking techniques described above into the accelerometer system, those inaccuracies can be reduced or eliminated. For example, the signal on the drive electrode $x_1$ is buffered and summed with a target mass-electrode voltage level by summing module 914. Summing module 914 provides the summed signal to the mass of MEMS device 202. Thus, if the circuitry (e.g., sensing amplifier 904, demodulator 906, force feedback module 908, and/or signal generator 910) of the accelerometer feedback system ages and causes an associated change in the DC bias voltage on the drive electrode, the DC bias voltage applied to the mass of MEMS device 202 tracks the change and the $V_{ME}$ of the transducer is not substantially changed. Accordingly, the apparent acceleration of MEMS device 100 is unchanged by changes in DC bias of the drive electrode. Similarly, techniques described herein may be adapted to other MEMS systems and other applications.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in oscillator and accelerometer embodiments, one of skill in the art will appreciate that the teachings herein can be utilized in other MEMS transducer applications. Variations and modifications of the embodiments disclosed herein may be made based on the description set forth herein, without departing from the scope and spirit of the invention as set forth in the following claims.

What is claimed is:

1. A method comprising:
    applying an electrode bias signal to an electrode of a microelectromechanical system (MEMS) device;
    applying a mass bias signal to a mass of the MEMS device suspended from a substrate of the MEMS device; and
    generating the mass bias signal based on a target mass-to-electrode bias signal level and a signal level of the electrode bias signal,
    wherein generating the mass bias signal comprises:
        replicating the electrode bias signal to generate a replica electrode bias signal; and
        boosting a signal level of the replica electrode bias signal by the target mass-to-electrode bias signal level to generate the mass bias signal.

2. The method, as recited in claim 1,
    wherein
        the replica electrode bias signal is provided to a node during a first time interval and
        the node is boosted by the target mass-to-electrode bias signal level during a second time interval to generate the mass bias signal.

3. The method, as recited in claim 1, further comprising:
    generating a signal on the electrode based on the mass bias signal, the electrode bias signal, and displacement of the mass of the MEMS device.

4. The method, as recited in claim 1, wherein the MEMS device is configured in an oscillator and the applying the mass bias signal inhibits change to a frequency of oscillation of the mass in response to changes in the electrode bias signal.

5. The method, as recited in claim 1, wherein the MEMS device is configured as an accelerometer and the applying the mass bias signal inhibits phase noise in an output signal.

6. The method, as recited in claim 1, further comprising:
generating a signal on the mass based on the mass bias signal, the electrode bias signal, and displacement of the mass of the MEMS device.

7. A method comprising:
applying an electrode bias signal to an electrode of a microelectromechanical system (MEMS) device;
applying a mass bias signal to a mass of the MEMS device suspended from a substrate of the MEMS device; and
generating the mass bias signal based on a target mass-to-electrode bias signal level and a signal level of the electrode bias signal, wherein generating the mass bias signal comprises:
buffering the electrode bias signal to generate a buffered electrode bias signal; and
boosting the buffered electrode bias signal by the target mass-to-electrode bias signal level to generate the mass bias signal.

8. The method, as recited in claim 7, wherein generating the mass bias signal comprises:
providing the buffered electrode bias signal to a node during a first time interval
wherein the buffered electrode bias signal is boosted during a second time interval to generate the mass bias signal.

9. The method, as recited in claim 7, further comprising:
generating a signal on the electrode based on the mass bias signal, the electrode bias signal, and displacement of the mass of the MEMS device.

10. The method, as recited in claim 7, wherein the MEMS device is configured in an oscillator and the applying the mass bias signal inhibits change to a frequency of oscillation of the mass in response to changes in the electrode bias signal.

11. The method, as recited in claim 7, further comprising:
generating a signal on the mass based on the mass bias signal, the electrode bias signal, and displacement of the mass of the MEMS device.

12. The method, as recited in claim 7, wherein the MEMS device is configured as an accelerometer and the applying the mass bias signal inhibits phase noise in an output signal.

13. An apparatus comprising:
a microelectromechanical system (MEMS) device comprising:
a first electrode configured to receive an electrode bias signal; and
a mass suspended from a substrate, the mass being configured to receive a mass bias signal; and
a mass bias signal generator configured to generate the mass bias signal based on a target mass-to-electrode bias signal and a signal level of the electrode bias signal, the mass bias signal generator comprising a charge pump configured to receive a signal having the electrode bias signal level, the charge pump being configured to boost the electrode bias signal level by a target plate-to-electrode signal level to thereby generate the mass bias signal.

14. The apparatus, as recited in claim 13, wherein the mass bias signal generator comprises:
a first node
wherein the charge pump is configured to provide the target plate-to-electrode signal to the first node during a first time interval,
wherein during a second time interval, the charge pump boosts a signal level on the first node by the electrode bias signal level and the charge pump provides the mass bias signal to the mass.

15. The apparatus, as recited in claim 13, further comprising:
an electrode bias signal generator configured to generate the electrode bias signal and provide the electrode bias signal level to the mass bias signal generator.

16. The apparatus, as recited in claim 13, wherein the mass bias signal generator comprises:
a buffer configured to generate a buffered version of the electrode bias signal having a same signal level as the electrode bias signal.

17. The apparatus, as recited in claim 13, further comprising:
a replica electrode bias signal generator configured to generate a replica of the electrode bias signal and provide the replica to the mass bias signal generator.

18. The apparatus, as recited in claim 13, further comprising:
a second electrode configured to receive the electrode bias signal; and
an amplifier coupled between the first and second electrodes, the amplifier being configured to generate the electrode bias signal.

19. The apparatus, as recited in claim 18, further comprising:
a first resistor coupled between the first and second electrodes; and
a capacitor coupled to at least one of the first and second electrodes,
wherein the MEMS device is configured as part of an oscillator.

20. The apparatus, as recited in claim 13, wherein the MEMS is configured to sense displacement of the mass with respect to the substrate and generate an indicator thereof based on the electrode bias signal.

* * * * *